United States Patent
Nishino et al.

(10) Patent No.: US 8,925,188 B2
(45) Date of Patent: Jan. 6, 2015

(54) COMPONENT MOUNTING APPARATUS

(75) Inventors: Toru Nishino, Kawasaki (JP); Kazuyuki Ikura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 243 days.

(21) Appl. No.: 12/824,707

(22) Filed: Jun. 28, 2010

(65) Prior Publication Data
US 2010/0325884 A1 Dec. 30, 2010

(30) Foreign Application Priority Data
Jun. 29, 2009 (JP) .................................. 2009-154106

(51) Int. Cl.
*B23P 19/00* (2006.01)
*H05K 3/30* (2006.01)

(52) U.S. Cl.
CPC ........ H05K 3/305 (2013.01); *H05K 2203/0195* (2013.01); *H05K 2203/1115* (2013.01)
USPC .................... 29/740; 29/743; 29/741; 29/742; 29/833

(58) Field of Classification Search
CPC . H01L 21/563; H01L 21/67144; H01L 24/81; H05K 13/0452; H05K 13/413; H05K 13/0408; H05K 13/08
USPC ................... 29/739–743, 719–721, 832–834; 228/180.21–180.22; 348/87, 126, 161
See application file for complete search history.

(56) References Cited

U.S. PATENT DOCUMENTS

| | | | | |
|---|---|---|---|---|
| 4,887,351 A | * | 12/1989 | Porterfield et al. | 29/740 |
| 4,979,290 A | * | 12/1990 | Chiba | 29/840 |
| 5,086,556 A | * | 2/1992 | Toi | 29/740 |
| 5,168,141 A | * | 12/1992 | Tashjian et al. | 219/121.63 |
| 5,359,203 A | * | 10/1994 | Hashii et al. | 250/559.46 |
| 5,519,495 A | * | 5/1996 | Kawaguchi | 356/615 |
| 5,627,913 A | * | 5/1997 | Spigarelli et al. | 382/151 |
| 5,694,219 A | * | 12/1997 | Kim | 356/615 |
| 5,739,846 A | * | 4/1998 | Gieskes | 348/87 |
| 5,992,013 A | * | 11/1999 | Morita | 29/833 |
| 6,135,522 A | * | 10/2000 | Su et al. | 414/752.1 |

(Continued)

FOREIGN PATENT DOCUMENTS

| | | |
|---|---|---|
| JP | 11-087413 A | 3/1999 |
| JP | 2000-156560 A | 6/2000 |

(Continued)

OTHER PUBLICATIONS

Japanese Office Action dated Mar. 5, 2013, issued in corresponding Japanese Patent Application No. 2009-154106, w/ partial English translation.

*Primary Examiner* — Minh Trinh
(74) *Attorney, Agent, or Firm* — Westerman, Hattori, Daniels & Adrian, LLP

(57) ABSTRACT

A mounting apparatus includes a stage device on which an installation substrate and a component are placed, a suction head provided vertically above the stage device, the suction unit moving in a direction perpendicular to the stage device, a contact attached to the suction head that comes into contact with an electrode of the component, a camera provided vertically above the suction head, the camera moving in a direction perpendicular to the suction head, and a control unit that controls operation of the stage device, operation of the suction head, application of electricity to the contact, and operation of the camera.

8 Claims, 15 Drawing Sheets

(56) References Cited

U.S. PATENT DOCUMENTS

| | | | |
|---|---|---|---|
| 6,366,310 B1 * | 4/2002 | Nagai et al. | 348/87 |
| 6,467,670 B2 * | 10/2002 | Higashi et al. | 228/1.1 |
| 7,102,148 B2 * | 9/2006 | Kodama et al. | 250/559.44 |
| 7,111,390 B2 * | 9/2006 | Shimamura et al. | 29/791 |
| 7,281,322 B2 * | 10/2007 | Onobori et al. | 29/832 |
| 7,325,298 B2 * | 2/2008 | Kobayashi et al. | 29/740 |
| 7,337,533 B2 * | 3/2008 | Imafuku et al. | 29/739 |

FOREIGN PATENT DOCUMENTS

| | | |
|---|---|---|
| JP | 2000-183404 A | 6/2000 |
| JP | 2002-9380 A | 1/2002 |
| JP | 2008-37947 A | 2/2008 |

* cited by examiner

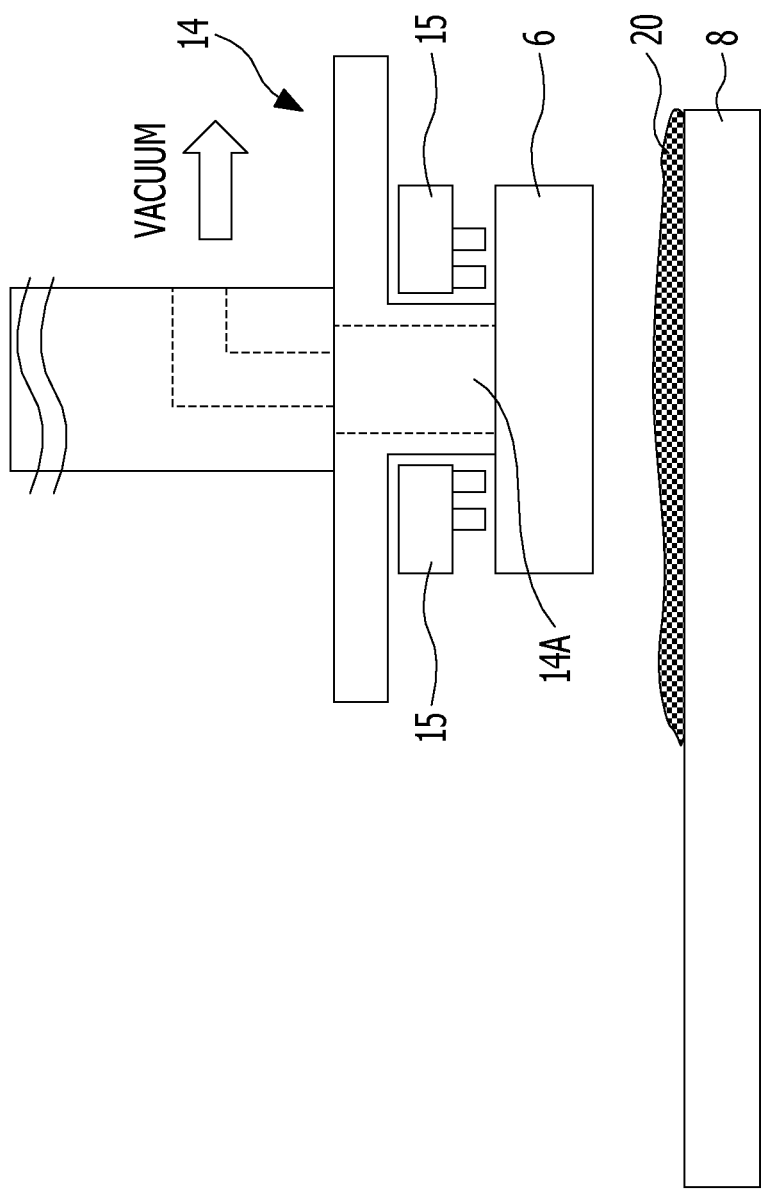

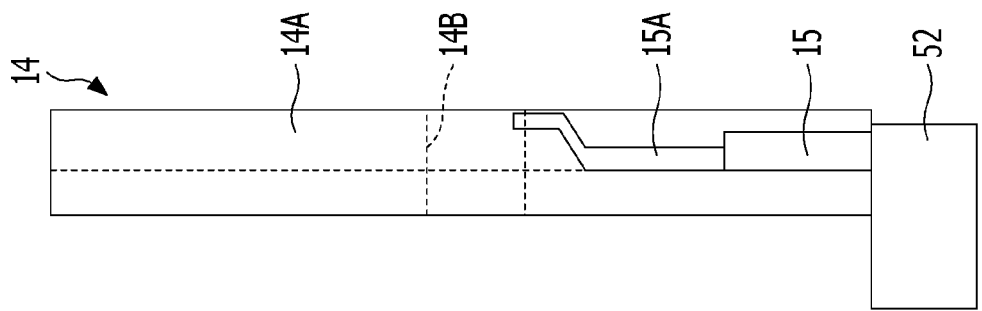
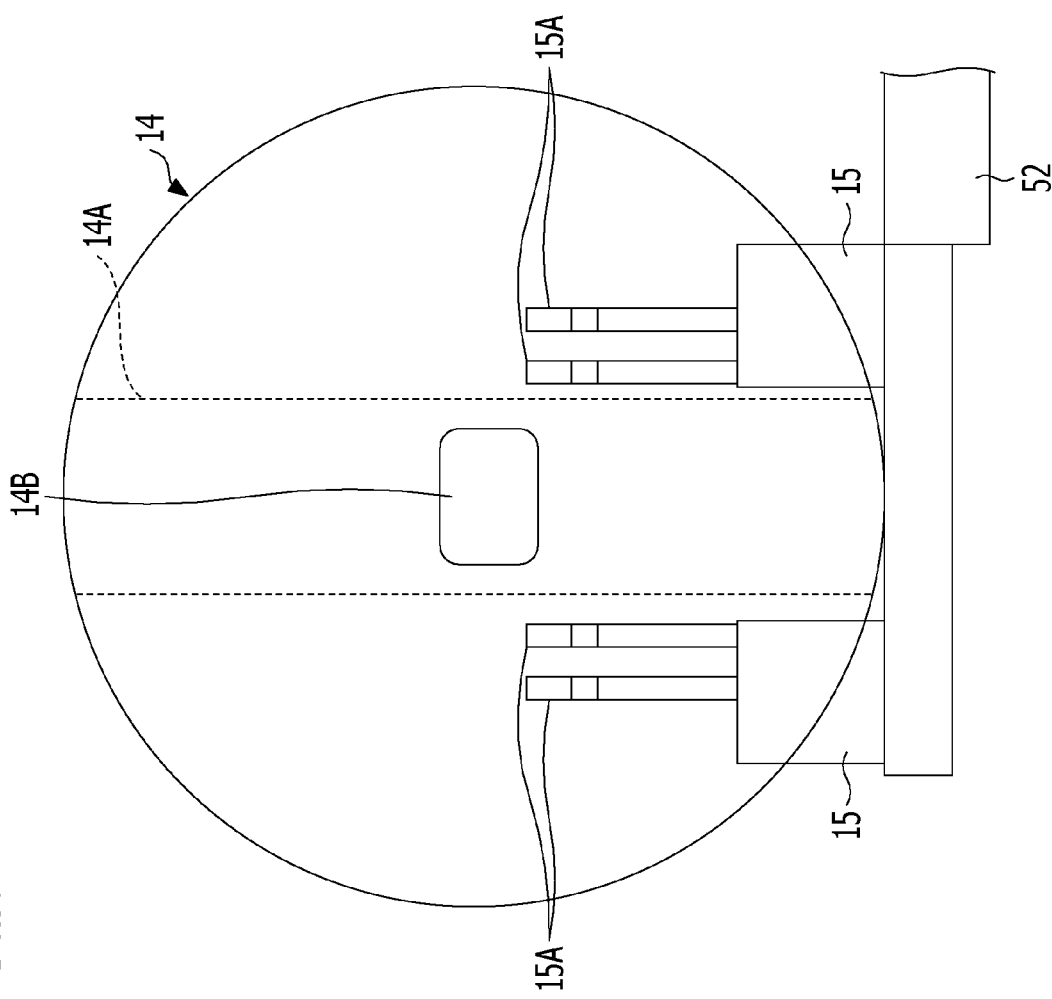

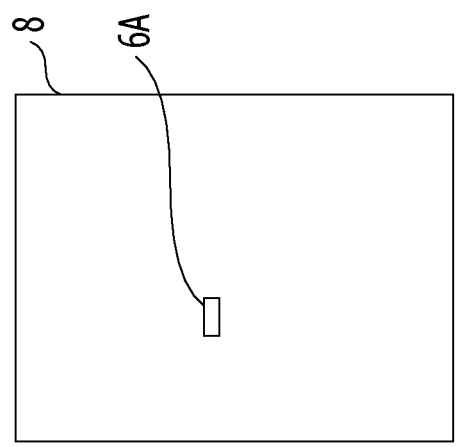

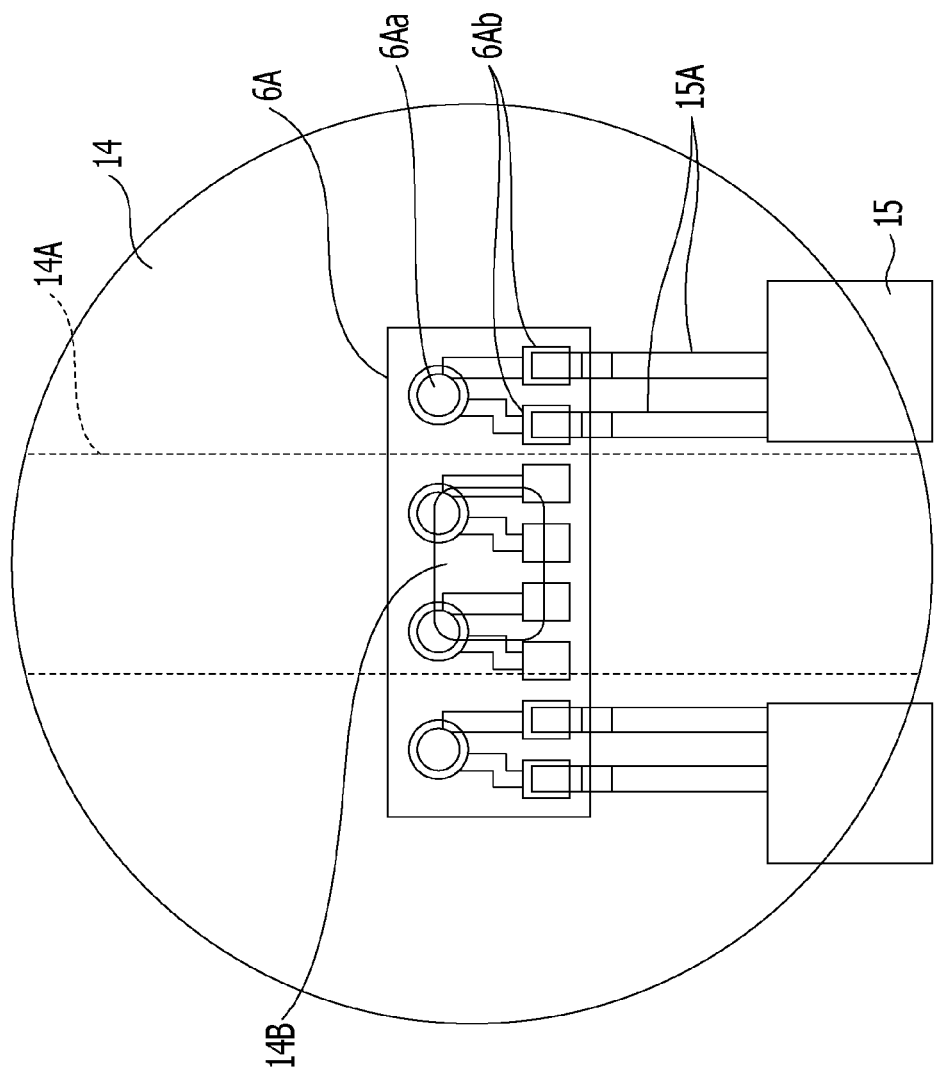

US 8,925,188 B2

COMPONENT MOUNTING APPARATUS

CROSS-REFERENCE TO RELATED APPLICATIONS

This application is based upon and claims the benefit of priority of the prior Japanese Patent Application No. 2009-154106, filed on Jun. 29, 2009, the entire contents of which are incorporated herein by reference.

FIELD

The embodiments discussed herein are related to a mounting apparatus.

BACKGROUND

A known method for mounting a component on a substrate includes fixing an electronic component or an optical component onto a substrate by using a thermosetting adhesive. In this method, the thermosetting adhesive is disposed between the component and the substrate, and the entire substrate is heated by using a heater so as to cure the thermosetting adhesive. In this case, since it is difficult to directly heat only the thermosetting adhesive, the entire substrate is heated by bringing the heater into contact with the underside of the substrate so as to heat the thermosetting adhesive.

When the entire substrate is heated to the curing temperature of the thermosetting adhesive, the substrate can sometimes become deformed and warped. When warpage occurs in the substrate, accuracy in the installation position of the component is impaired.

Japanese Laid-Open Patent Publication No. 11-87413 discloses a method of preliminarily mixing an ultraviolet curable adhesive into a thermosetting adhesive, and curing the surface of the adhesive by emitting ultraviolet light thereto so that a component can be temporarily installed and fixed in position.

Japanese Laid-Open Patent Publication No. 2000-156560 discloses a method of locally heating a substrate, equipped with a component to be mounted thereon, from the underside of the substrate and the top side of the component so as to heat and cure thermosetting resin between the component and the substrate.

SUMMARY

According to an embodiment, a mounting apparatus includes a stage device on which an installation substrate and a component are placed, a suction head provided vertically above the stage device, the suction unit moving in a direction perpendicular to the stage device, a contact attached to the suction head that comes into contact with an electrode of the component, a camera provided vertically above the suction head, the camera moving in a direction perpendicular to the suction head, and a control unit that controls operation of the stage device, operation of the suction head, application of electricity to the contact, and operation of the camera.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a side view of a suction head;

FIG. 9A is a plan view of a suction head and contact terminals;

FIG. 9B is a side view of the suction head and one of the contact terminals;

FIG. 10 is a plan view of an installation substrate equipped with a surface emitting laser (VCSEL);

FIG. 13 is a plan view showing a state where the surface emitting laser (VCSEL) is attached to the suction head by suction, as viewed from above the suction head;

DESCRIPTION OF EMBODIMENTS

As described above, when a substrate is entirely heated for heating a thermosetting adhesive, the substrate becomes deformed and warped. Although the warpage is gradually reduced as the heating is stopped, the thermosetting adhesive may sometimes shrink as it cures at the top side of the substrate, resulting in slight warpage remaining in the substrate even after it cools down to room temperature.

Although such slight warpage in the substrate is not a problem in the case of common electronic components, this slight warpage can be a problem with components whose performance is affected by their installed positions and the levelness of their installation surfaces. Examples of such components include surface emitting lasers (VCSEL) and photo-diodes (PD).

For example, there is a case where a surface emitting laser and a photo-diode are installed on the same substrate, and the photo-diode is used to detect laser light emitted from the surface emitting laser and returning to the photo-diode after undergoing reflection. In that case, if the substrate is warped even by a small amount, parallelism between the surface (light-emitting surface) of the surface emitting laser and the surface (light-receiving surface) of the photo-diode may be lost, and the two surfaces become inclined with respect to each other by an amount equivalent to the warpage. As a result, the optical axis of the surface emitting laser and the optical axis of the photo-diode become deviated from design optical axes, possibly making it difficult to accurately supply the laser light from the surface emitting laser to a lens system. There is also a possibility that it may be difficult to accurately make the returning laser light incident on the light-receiving surface of the photo-diode.

In light of this, when mounting the component on the substrate, if the thermosetting adhesive can be locally heated instead of heating the substrate, warpage of the substrate can be minimized, so that the component that requires highly accurate mounting can be properly mounted on the substrate.

Figure 1:
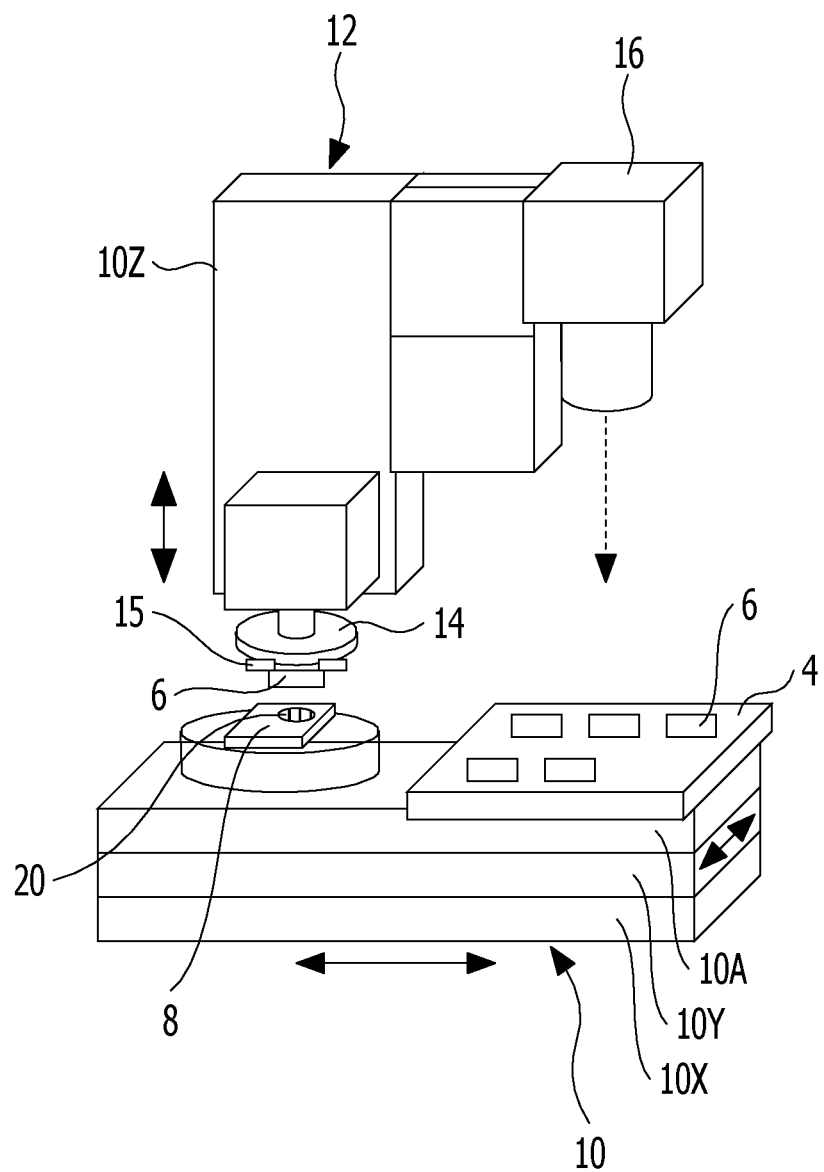
FIG. 1 illustrates the overall configuration of a mounting apparatus according to a first embodiment.

FIG. 1 schematically illustrates the overall configuration of a mounting apparatus according to a first embodiment. A mounting apparatus 2 shown in FIG. 1 is configured to lift each of components 6 from a component tray 4 and to install the component 6 onto an installation substrate 8 so that the component 6 can be mounted thereon. The component 6 is a device that generates heat when driven, such as a semiconductor device or an optical device. The installation substrate 8 is, for example, a printed circuit board composed of a glass epoxy material.

The mounting apparatus 2 includes a stage device 10 for moving the component tray 4 and the installation substrate 8, and a positioning-installation unit 12 disposed vertically above the stage device 10. The stage device 10 includes a table 10A, an X-axis moving mechanism 10X, a Y-axis moving mechanism 10Y, and a Z-axis moving mechanism 10Z. The X-axis moving mechanism 10X moves the table 10A in the X-axis direction (horizontal direction). The Y-axis moving mechanism 10Y moves the table 10A in the Y-axis direction (horizontal direction orthogonal to the X-axis direction). On the other hand, the Z-axis moving mechanism 10Z moves a suction head 14, to be described below, in the Z-axis direction (vertical direction) relative to the table 10A.

The positioning-installation unit 12 is provided with the suction head 14 for supporting the component 6, and a camera 16 for image-recognizing the component tray 4 placed on the table 10A. The suction head 14 includes contact terminals 15 each having a contact 15A that comes into contact with an electrode of the component 6 attached thereto by suction.

Figure 3B:
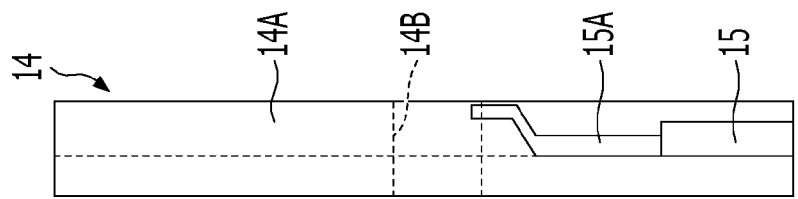
FIG. 3B is a side view of the suction head, as viewed from one side along an X axis.
Figure 3A:
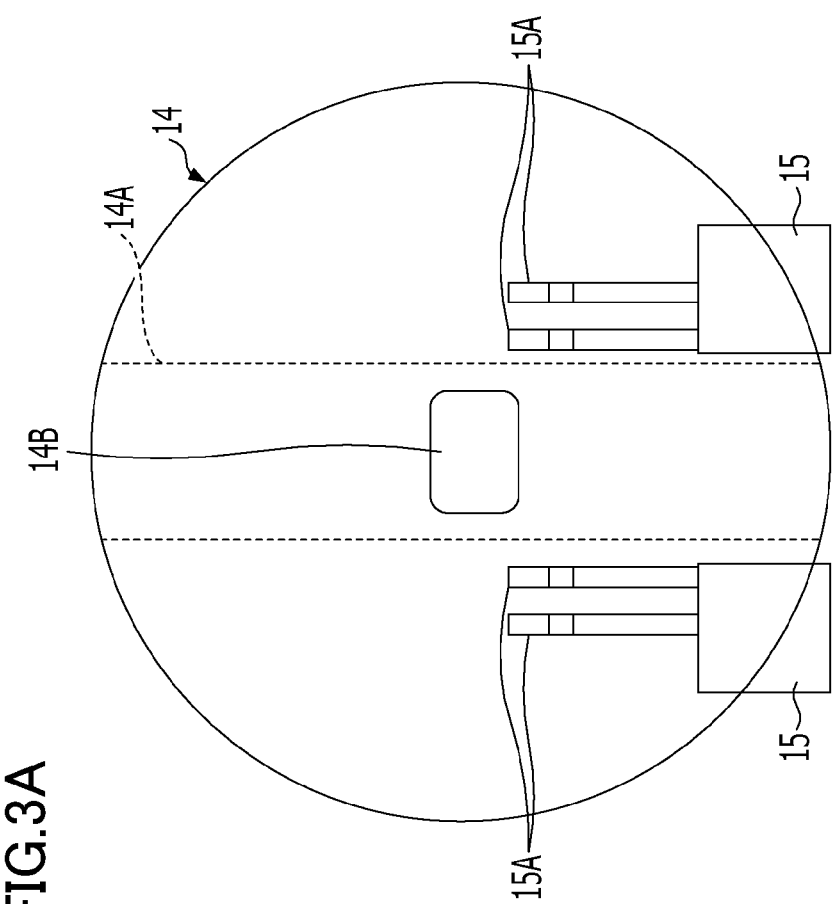
FIG. 3A is a plan view of the suction head, as viewed from above along a Z axis.
Figure 3C:
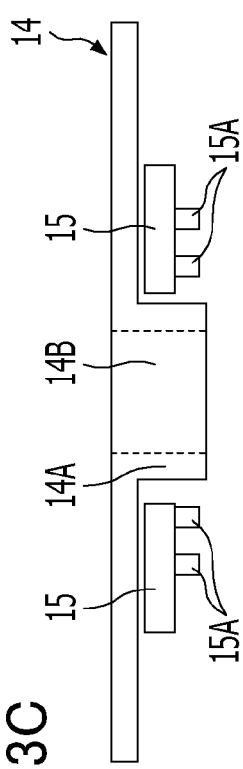
FIG. 3C is a front view of the suction head, as viewed from the front along a Y axis.

FIG. 2 is a side view of the suction head 14. FIG. 3A is a plan view of the suction head 14, as viewed from above, along the Z axis. FIG. 3B is a side view of the suction head 14, as viewed from one side, along the X axis. FIG. 3C is a front view of the suction head 14, as viewed from the front, along the Y axis. A midsection of the suction head 14 is provided with a nozzle 14A, and the component 6 is suctioned by a suction hole 14B of the nozzle 14A so that the component 6 can be attached to and held by the nozzle 14A by suction. The contact terminals 15 disposed near the nozzle 14A are attached to positions where the contacts 15A thereof come into contact with the electrode of the component 6 when the component 6 is attached to the nozzle 14A by suction. The contact terminals 15 are connected to a power source (not shown), so that power can be supplied to the component 6 via the contacts 15A.

By lowering the suction head 14 from the state shown in FIG. 2, the component 6 held by the suction head 14 can be placed on the installation substrate 8. Since a thermosetting adhesive 20 is preliminarily applied to a component-installation position of the installation substrate 8, the thermosetting adhesive 20 becomes interposed between the component 6 and the installation substrate 8. While the component 6 is still held by the suction head 14, power is supplied from the contact terminals 15 to the component 6 so as to drive the component 6. The component 6 is a semiconductor device or an optical device and is configured to generate heat by being driven. If the component 6 generates a large amount of heat relative to its size, the temperature of the component 6 becomes equal to or higher than the curing temperature of the thermosetting adhesive 20. Therefore, with the heat from the component 6, the thermosetting adhesive 20 is heated and cured.

Accordingly, in this embodiment, the thermosetting adhesive 20 can be cured with only the heat generated by driving the component 6, without having to heat the installation substrate 8. Consequently, warpage that can occur when the entire substrate 8 is heated can be prevented, and the installation substrate 8 can thus be maintained in a flat state even after mounting the component 6 thereon.

Furthermore, since the thermosetting adhesive 20 corresponding to each of the components 6 to be mounted can be heated individually, the thermosetting adhesive 20 can be preliminarily applied to all of the multiple component-installation positions on the installation substrate 8. Therefore, only a single application process for the thermosetting adhesive 20 is necessary, thereby allowing for improved working efficiency.

Although the thermosetting adhesive 20 is heated by only using the heat generated by the component 6 in this embodiment, the time required for heating and curing the thermosetting adhesive 20 can be shortened by supplementarily heating the entire substrate 8. In that case, although the installation substrate 8 is entirely heated from the underside thereof, the heating temperature may be kept to a low value so as to prevent warpage of the installation substrate 8. For example, if the installation substrate 8 is composed of a glass epoxy material, supposing that the room temperature is +20° C. as a guide, the heating temperature for the entire substrate 8 may be set at about 50° C. so that the thermosetting adhesive 20 can be quickly heated to the curing temperature while preventing warpage of the installation substrate 8, thereby shortening the heating and curing time.

Figure 4:
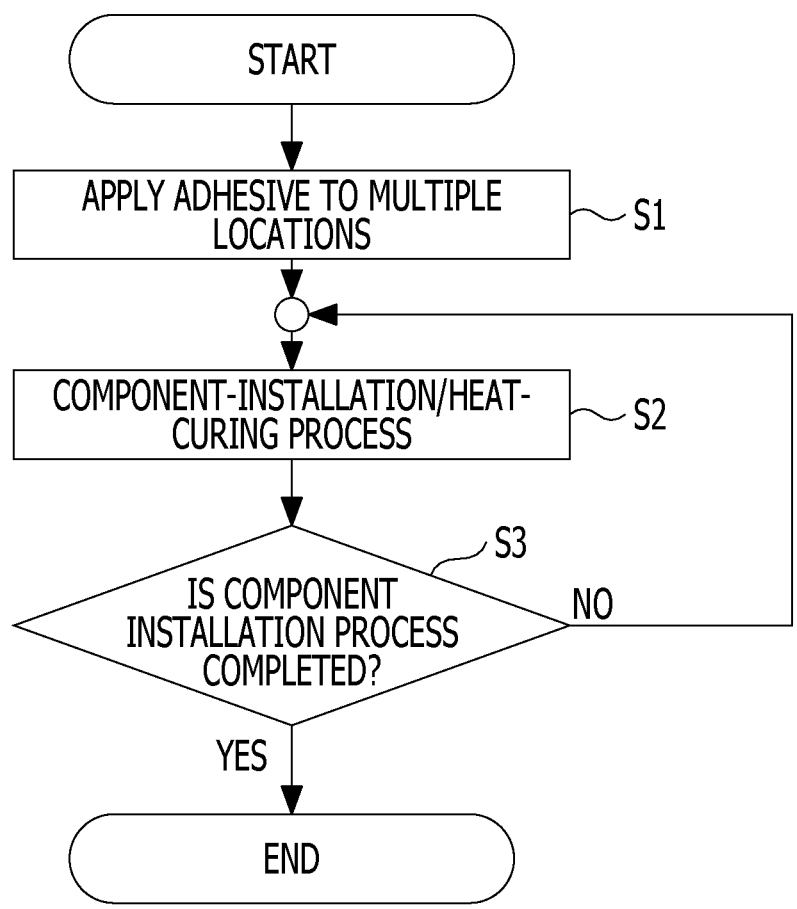
FIG. 4 illustrates the overall procedure of a component mounting process.
Figure 5:
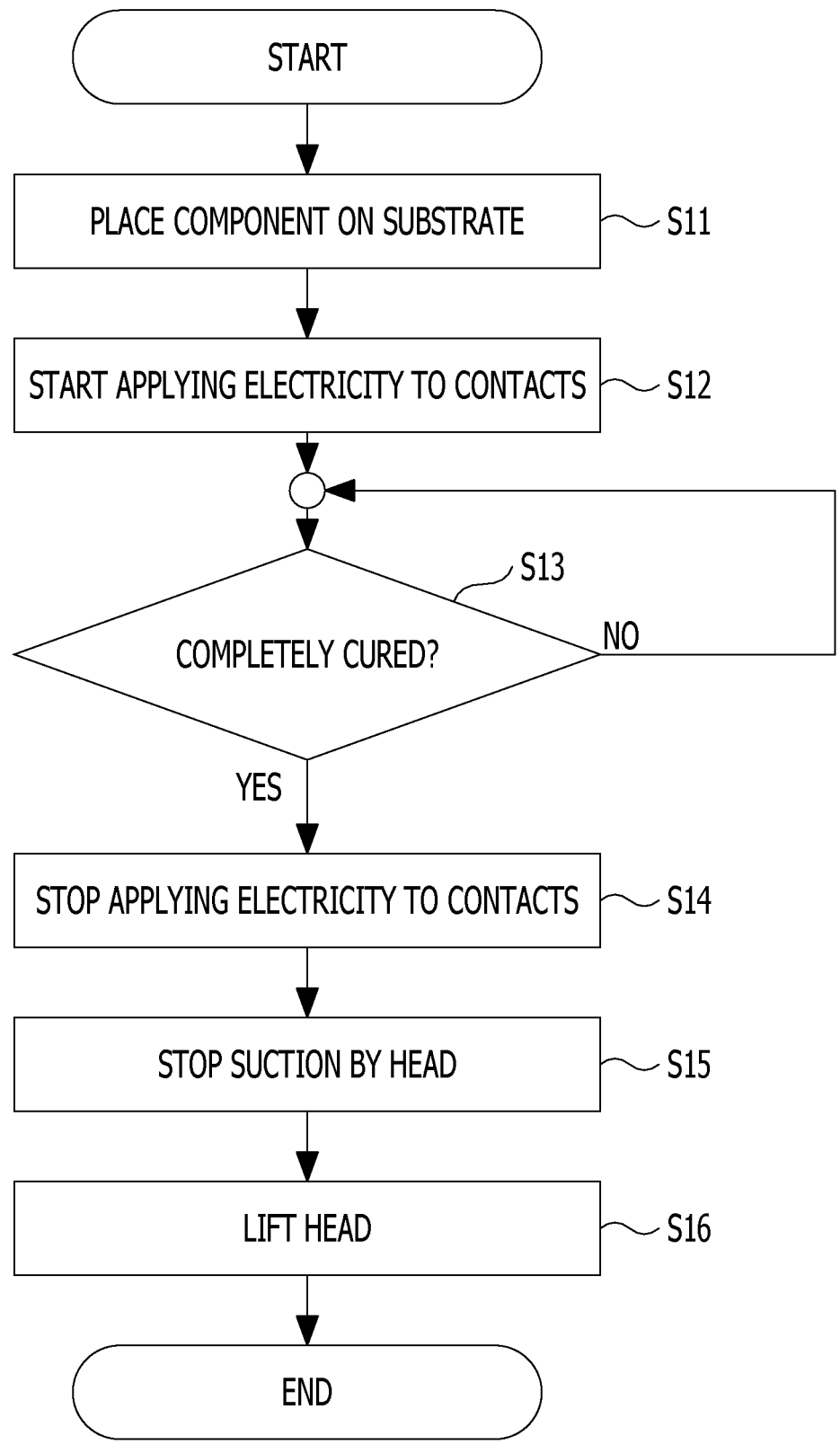
FIG. 5 illustrates a component installation process.

Next, a component installation method performed by the mounting apparatus 2 having the above-described configuration will be described. FIG. 4 is a flow chart illustrating the overall procedure of a component mounting process. FIG. 5 is a flow chart of a component installation process.

Referring to FIG. 4, in order to install each component 6 on the installation substrate 8, the thermosetting adhesive 20 is applied to each component-installation position on the installation substrate 8 in step S1. Although the application of the thermosetting adhesive 20 is preferably performed using a dispenser or the like, the application is not limited to the use of a dispenser. In this embodiment, since the thermosetting adhesive 20 at each component-installation position can be locally heated and cured, the thermosetting adhesive 20 can be preliminarily applied to all of the multiple component-installation positions on the installation substrate 8.

Upon completion of the application of the thermosetting adhesive 20, the process proceeds to step S2 where a component-installation/heat-curing process is performed. This component-installation/heat-curing process involves installing each component 6 at a corresponding component-installation position of the installation substrate 8, and heating the thermosetting adhesive 20 between the component 6 and the installation substrate 8 by using heat generated by the component 6 so as to cure the thermosetting adhesive 20, thereby mounting the component 6 on the installation substrate 8. In this case, the components 6 to be mounted are independently mounted in a one-by-one fashion such that, when one component 6 is installed at a corresponding component-installation position, the thermosetting adhesive 20 for the component 6 is heated and cured, and when this is completed, a subsequent component 6 is installed at another component-installation position, and then the thermosetting adhesive 20 for the component 6 is heated and cured.

Therefore, when mounting of one component 6 is completed, the process proceeds to step S3 where it is determined whether mounting of all of the components 6 to be mounted is completed. If it is determined that mounting of all of the components 6 to be mounted is not completed, the process returns to step S2 so as to perform mounting of a subsequent component 6. In contrast, when it is determined that mounting of all of the components 6 to be mounted is completed, the component mounting process ends.

The determination step of whether or not mounting of all of the components 6 to be mounted is completed can be performed by, for example, determining whether or not the mounting process is performed for the pre-known number of components 6 to be mounted. An alternative determination method that can be used involves image-recognizing the entire substrate 8 with the camera 16 and determining whether the components 6 are mounted at all of the component-installation positions.

Next, the component installation process performed in step S2 described above will be described in detail with reference to FIG. 5.

The installation substrate 8 with the thermosetting adhesive 20 applied to each component-installation position is placed and fixed at a predetermined position on the table 10A of the aforementioned mounting apparatus 2. The mounting apparatus 2 then performs mounting of each component 6.

First, in step S11, the table 10A is moved so as to move the component 6 on the component tray 4 to a position directly below the suction head 14. Then, the component 6 is attached to and held by the suction of the suction head 14. Subsequently, the table 10A is moved so as to move the installation substrate 8 to the corresponding component-installation position. When the component-installation position of the installation substrate 8 is directly below the held component 6, the suction head 14 is lowered so as to place the component 6 at the component-installation position. In this case, the thermosetting adhesive 20 applied to the component-installation position becomes interposed between the component 6 and the installation substrate 8. Even after the component 6 is placed at the component-installation position, pressure is applied to the component 6 while the suction head 14 continues to hold the component 6 by suction.

In the above step, until the component 6 is lowered in the vertical direction to the installation position so as to be brought into contact with the thermosetting adhesive 20 on the installation substrate 8, the component 6 is lowered with low pressure (of, for example, 0.005 N to 0.01 N). Thus, an impact force generated when the component 6 comes into contact with the thermosetting adhesive 20 can be alleviated. After the component 6 is placed on the installation substrate 8, the component 6 is preferably pressed with high pressure (of, for example, 0.02 N to 0.1 N) at the installation position. By increasing the pressure, the component 6 can be stably set in position.

Then, the process proceeds to step S12 where electricity is applied to the contact terminals 15. In a heating/curing step, power is supplied to the component 6 via the contacts 15A while the component 6 is held by the suction head 14, thereby driving the component 6. The driving of the component 6 causes the component 6 to generate heat, thereby starting the heating and curing of the thermosetting adhesive 20 in contact with the lower surface of the component 6.

Subsequently, in step S13, it is determined whether or not the thermosetting adhesive 20 is completely cured. This determination step can be performed by, for example, determining whether or not a predetermined time has elapsed since the start of the application of electricity to the component 6. Specifically, the time that it takes for the thermosetting adhesive 20 to reach the curing temperature after driving the component 6 and the time that it takes for the thermosetting adhesive 20 to cure (to reach desired hardness) are already known, and it may be determined whether or not this curing time has elapsed.

If it is determined in step S13 that the thermosetting adhesive 20 is not completely cured (for example, if it is determined that a predetermined curing time has not elapsed), the process repeats step S13. On the other hand, when it is determined in step S13 that the thermosetting adhesive 20 is completely cured (for example, when it is determined that the predetermined curing time has elapsed), the process proceeds to step S14. Step S14 is a step for stopping the application of electricity to the contact terminals 15. Subsequently, in step S15, the suction of the component 6 by the suction head 14 is stopped. Then, in step S16, the suction head 14 is lifted away from the component 6.

Accordingly, with the mounting method according to this embodiment, since the thermosetting adhesive 20 is heated and cured using the heat generated by the component 6, only the section with the thermosetting adhesive 20 can be locally heated without having to heat the entire installation substrate 8. Consequently, the installation substrate 8 can be prevented from warping, and the installation substrate 8 can thus be maintained in a flat state, whereby the component 6 can be mounted at a desired position and in a desired state with high accuracy.

Similar to a mounting apparatus according to a second embodiment, to be described below, the operation of each section of the mounting apparatus 2 according to this embodiment is controlled by a control computer, which is an example of a control unit. In detail, the above-described mounting process is performed by controlling the operation of the stage device 10, the operation of the suction head 14, the operation of the camera 16, and the operation of the contact terminals 15 (i.e., the application of electricity to the contact terminals 15) by using the control computer.

Next, a second embodiment will be described.

Figure 6:
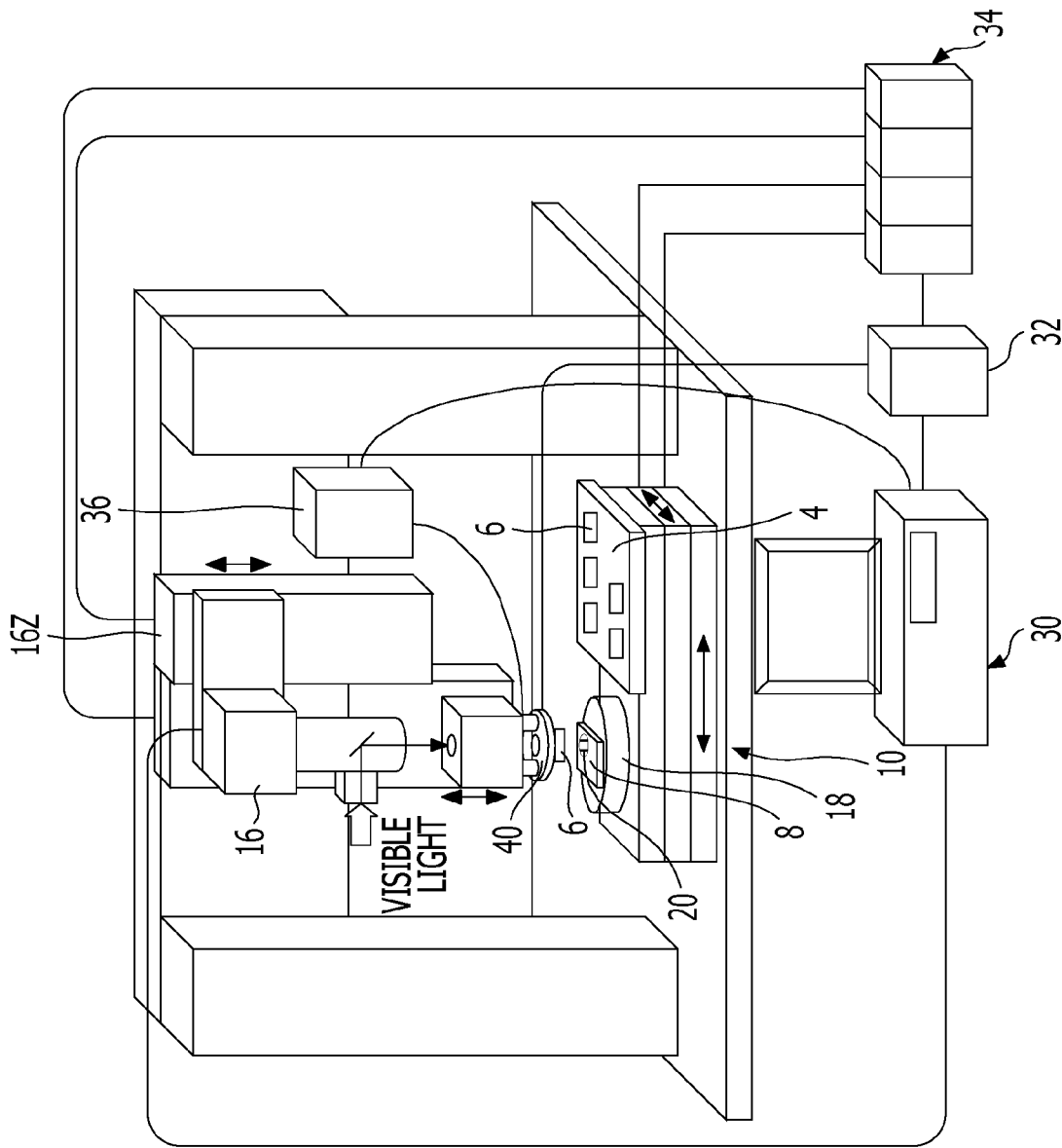
FIG. 6 illustrates the overall configuration of a mounting apparatus according to a second embodiment.

FIG. 6 illustrates the overall configuration of a mounting apparatus according to the second embodiment. In FIG. 6, components similar to those shown in FIG. 1 are given the same reference numerals, and the descriptions thereof will not be repeated.

The overall configuration of the mounting apparatus according to the second embodiment is similar to that of the mounting apparatus 2 according to the first embodiment shown in FIG. 1, and the following description will be focused on how the mounting apparatus according to the second embodiment differs from the mounting apparatus 2 according to the first embodiment.

In the mounting apparatus according to the second embodiment, a suction head unit 40 that includes a suction head 14 is composed of a transparent material, such that the suction head unit 40 is configured to transmit light. Therefore, a camera 16 disposed directly above the suction head unit 40 can perform image recognition by acquiring an image of an installation substrate 8 and a component 6 that are located below the suction head unit 40.

A lower camera portion that accommodates optical components of the camera 16 is supplied with visible light for lighting. Visible light supplied from a visible-light emitting device (not shown) is reflected by a half mirror 16B, travels toward the suction head unit 40 along an optical axis of the camera 16, and then passes through the transparent suction head unit 40 so as to be emitted onto the installation substrate 8 and the component 6.

The camera 16 is movable in the Z-axis direction (vertical direction) by a Z-axis camera-moving mechanism 16Z. By adjusting the vertical position of the camera 16 and the vertical position of the suction head unit 40, for example, light can be focused on the component 6 attached to the suction head 14 by suction so as to acquire an image of the component 6. On the other hand, when acquiring an image of the installation substrate 8 on a stage device 10, the light previously focused on the component 6 attached to the suction head 14 by suction may be subsequently focused on the installation substrate 8.

By making the suction head unit 40 transparent and emitting the visible light for lighting along the optical axis of the camera 16, the mounting process of the component 6 can be performed while using the camera 16 to monitor the condition of the installation substrate 8 and the component 6.

In this embodiment, a table 10A on which the installation substrate 8 is placed is provided with a supplementary heater 18. The supplementary heater 18 is a heater for supplementarily heating the installation substrate 8 during the mounting process. In this embodiment, a thermosetting adhesive 20 is mainly heated with heat generated by driving the component 6, and the heating of the entire substrate 8 using the supplementary heater 18 is only supplementary. Although the supplementary heater 18 heats the entire substrate 8 from the underside thereof, the installation substrate 8 can be prevented from warping by setting the heating temperature to a low value. In contrast, if the heating temperature for the entire substrate 8 is high, the condition of the thermosetting adhesive 20 changes, which can disadvantageously lead to increased positional deviation of the component 6. Therefore, it is preferable that the heating temperature be set to a low value. For example, if the installation substrate 8 is composed of a glass epoxy material, supposing that the room temperature is +20° C. as a guide, the heating temperature for the entire substrate 8 may be set at about 50° C. so that the thermosetting adhesive 20 can be quickly heated to the curing temperature while preventing warpage of the installation substrate 8, thereby shortening the heating and curing time.

The supplementary heater 18 may be incorporated in a rotary moving mechanism. The rotary moving mechanism is provided on the table 10A, and is a mechanism for adjusting the position of the installation substrate 8 by rotating the installation substrate 8 on the table 10A.

The operation of each moving mechanism of the stage device 10 is controlled by a control computer 30. The control computer 30 drives a motor driver 34 via a device-driving power source 32 so as to drive an X-axis moving mechanism 10X, a Y-axis moving mechanism 10Y, a Z-axis moving mechanism 10Z, and the rotary moving mechanism of the stage device 10, and the Z-axis camera-moving mechanism 10Z. The device-driving power source 32 supplies power to the component 6 (i.e., the component 6 held by the suction head 14) during the mounting process in response to a command from the control computer 30. Consequently, the component 6 is driven and thus generates heat, so that the thermosetting adhesive 20 is heated and cured with this heat.

A vacuum generator 36 is connected to the suction head unit 40 via a passage provided in a pressing mechanism that moves the suction head unit 40 in the vertical direction. The vacuum generator 36 is, for example, a vacuum pump or a suction pump, and is configured to create vacuum (suction force) in response to a command from the control computer 30 so that the component 6 is attached to the suction head 14 by suction of the suction head unit 40.

The control computer 30 controls the operation of the camera 16 where an image of the installation substrate 8 and the component 6 is acquired, and loads the acquired image data from the camera 16. Based on the acquired image data from the camera 16, the control computer 30 controls each section of the mounting apparatus during the mounting process.

Next, a component installation method performed by the mounting apparatus having the above-described configuration will be described. The overall procedure of the component installation process is the same as that performed by the mounting apparatus 2 according to the first embodiment described above, and therefore, the description thereof will not be repeated. In this embodiment, the component-installation/heat-curing process involves heating and curing the thermosetting adhesive 20 while monitoring the position of the component 6 using the camera 16.

Figure 7:
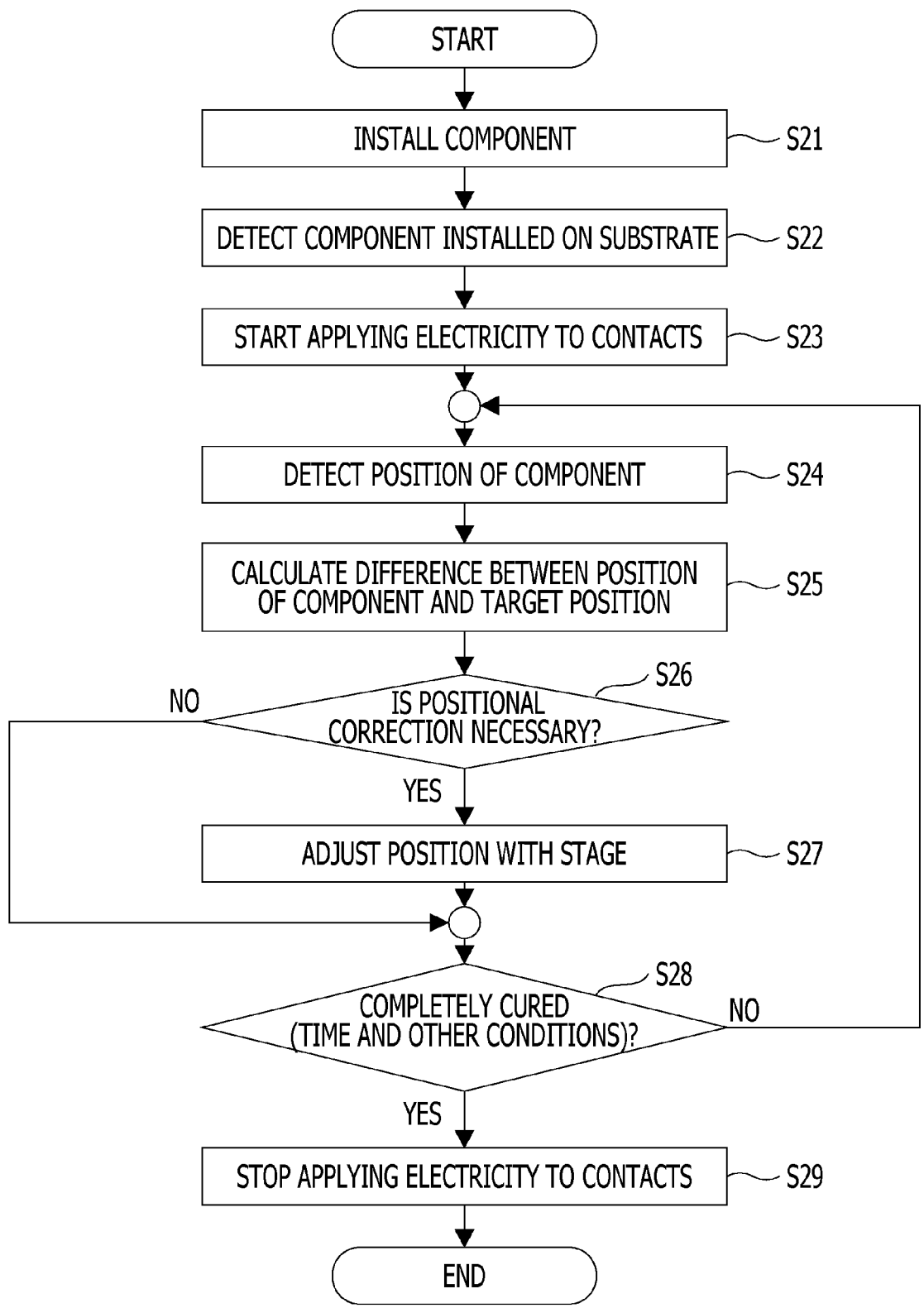
FIG. 7 illustrates a component installation process according to the second embodiment.

Next, the component-installation/heat-curing process will be described in detail with reference to FIG. 7. FIG. 7 is a flow chart of the component-installation/heat-curing process.

The installation substrate 8 with the thermosetting adhesive 20 applied at each component-installation position is placed and fixed at a predetermined position on the table 10A of the aforementioned mounting apparatus. The mounting apparatus then performs mounting of each component 6.

First, in step S21, the table 10A is moved so as to move the component 6 on the component tray 4 to a position directly below the suction head unit 40. Then, the component 6 is attached to and held by the suction head 14 by suction of the suction head unit 40. Subsequently, the table 10A is moved so as to move the installation substrate 8 to the corresponding component-installation position. When the component-installation position of the installation substrate 8 is directly below the held component 6, the suction head unit 40 is lowered so as to place the component 6 at the component-installation position. In this case, the thermosetting adhesive 20 applied to the component-installation position becomes interposed between the component 6 and the installation substrate 8. Even after the component 6 is placed at the component-installation position, the suction head 14 continues to hold the component 6 by suction. Furthermore, electricity is applied to the supplementary heater 18 before or after placing the component 6 at the component-installation position so as to heat the entire substrate 8 to a predetermined temperature. The predetermined temperature is, for example, about 50° C., as mentioned above, which is a temperature that does not cause the installation substrate 8 to warp.

Then, in step S22, based on an image of the component 6 on the installation substrate 8 acquired by the camera 16, it is detected that the component 6 is properly disposed at the component-installation position. In step S23, electricity is applied to the contact terminals 15 so as to drive the component 6. Then, in step S24, the position of the component 6 is detected on the basis of the image of the component 6 acquired by the camera 16.

Subsequently, in step S25, the control computer 30 calculates a difference between the detected position of the component 6 and the component-installation position. Then, in step S26, the control computer 30 determines whether or not the position of the component 6 needs to be corrected. Specifically, if the difference between the detected position of the component 6 and the component-installation position is greater than a predetermined distance, it is determined that the position of the component 6 needs to be corrected. If the thermosetting adhesive 20 is not yet completely cured since the start of the application of electricity to the component 6, the component 6 can be moved to the correct component-installation position by slightly moving the component 6.

If it is determined in step S26 that the position of the component 6 needs to be corrected, the process proceeds to step S27. In step S27, the control computer 30 moves the table 10A and corrects the position of the component 6 so that the difference, calculated in step S25, between the detected position of the component 6 and the component-installation position is eliminated.

Subsequently, in step S28, the control computer 30 determines whether or not the thermosetting adhesive 20 is completely cured. This determination step can be performed by, for example, determining whether or not a predetermined time has elapsed since the start of the application of electricity to the component 6. Specifically, the time that it takes for the thermosetting adhesive 20 to cure (to reach desired hardness) by heating the thermosetting adhesive 20 with the heat generated by the component 6 is already known, and it may be determined whether or not this curing time has elapsed. Since the curing time varies depending on, for example, the amount of heat generated by the component 6, the ambient temperature, and the heating temperature by the supplementary heater 18, the curing time may be determined using these values as parameters.

If it is determined in step S26 that the position of the component 6 does not need to be corrected, the process proceeds to step S28 by skipping step S27.

If it is determined in step S28 that the thermosetting adhesive 20 is not completely cured (for example, if it is determined that the set curing time has not elapsed), the process returns to step S24 so as to repeat steps S24 to S28. On the other hand, when it is determined in step S28 that the thermosetting adhesive 20 is completely cured (for example, when it is determined that the set curing time has elapsed), the process proceeds to step S29. Step S29 is a step for stopping the application of electricity to the contact terminals 15 so as to stop the driving of the component 6.

When the heating and curing of the thermosetting adhesive 20 using the heat generated by the component 6 are completed and the application of electricity to the contact terminals 15 is stopped, the suction head 14 stops holding the component 6 by suction, and the suction head 14 is lifted upward. Then, the position of the mounted component 6 is recognized on the basis of an image acquired by the camera 16, and it is determined whether or not an amount of positional deviation of the component 6 is smaller than a predetermined deviation amount. If the amount of positional deviation of the component 6 is smaller than the predetermined deviation amount, it is determined that the component 6 is properly mounted on the installation substrate 8. In contrast, if the amount of positional deviation of the component 6 is greater than or equal to the predetermined deviation amount, it is determined that the mounted position of the component 6 is improper.

When it is determined that the component 6 is properly mounted on the installation substrate 8, it is determined whether there are any subsequent components 6 to be mounted. If there is a subsequent component 6 to be mounted, the above-described steps are repeated so as to mount the subsequent component 6 on the installation substrate 8.

Accordingly, with the mounting method according to this embodiment, since the control computer 30 and the camera 16 positioned directly above the transparent suction head unit 40 are used for detecting the position of the component 6 even during the heating and curing of the thermosetting adhesive 20, an error in the position of the component 6 relative to the component-installation position can be calculated, so that positional deviation of the component 6 can be corrected by moving the installation substrate 8 until the thermosetting adhesive 20 becomes completely cured. Therefore, even when the component 6 becomes positionally deviated in the course of curing of the thermosetting adhesive 20, this positional deviation can be immediately corrected, thereby allowing for higher mounting accuracy and reducing improper mounting.

Next, a third embodiment will be described.

A mounting apparatus according to the third embodiment has a configuration similar to that of the mounting apparatus according to the second embodiment, but differs therefrom in having a linear scale for tactile sensing and a contact pressing mechanism for slightly moving contact terminals 15 so as to bring contacts 15A into contact with an electrode of a component 6.

Figure 8:
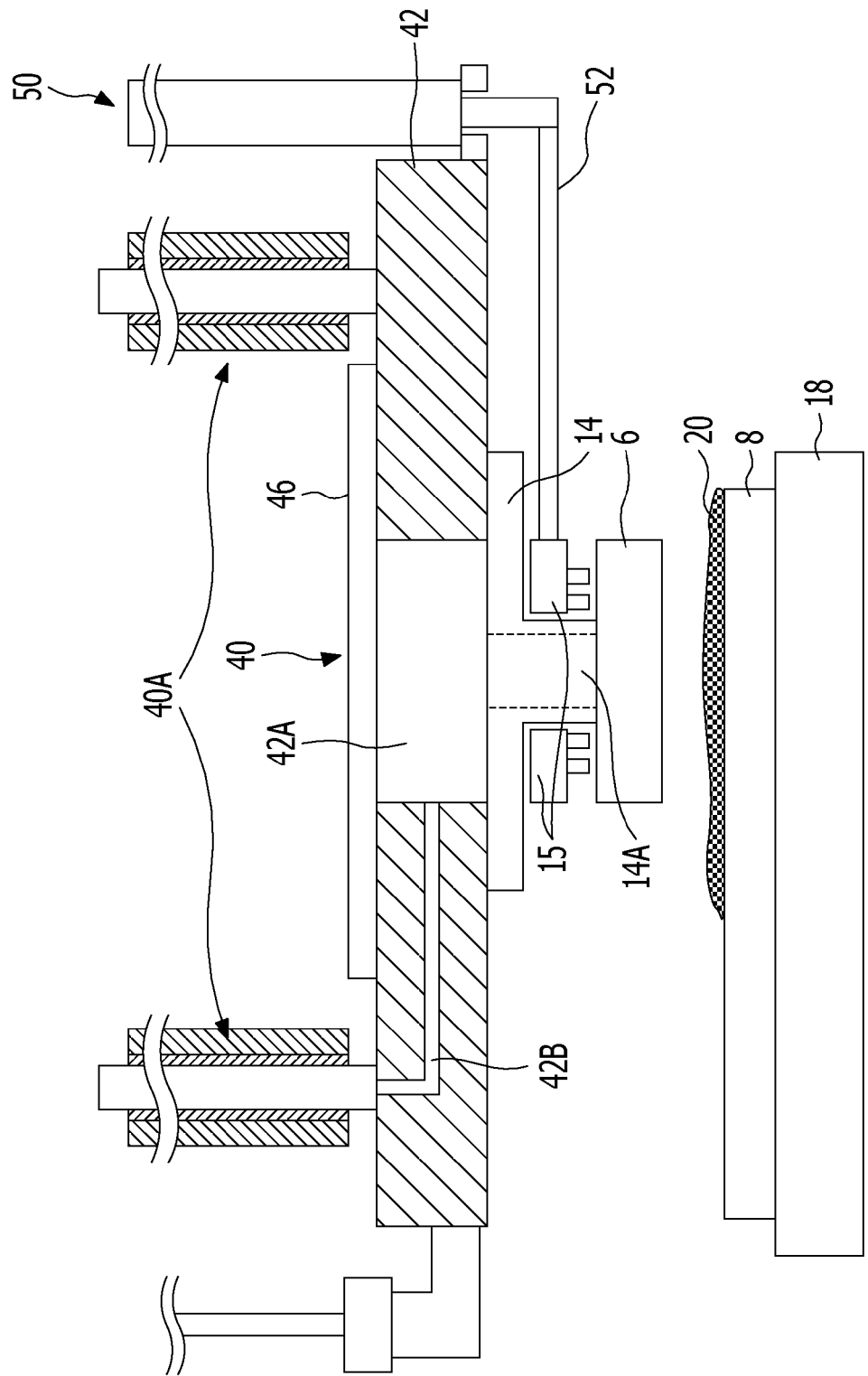
FIG. 8 is a side view of a suction head unit of a mounting apparatus according to a third embodiment.

FIG. 8 is a side view of a suction head unit 40 of the mounting apparatus according to the third embodiment. In FIG. 8, components similar to those shown in FIG. 6 are given the same reference numerals, and the descriptions thereof will not be repeated.

In a suction head 14 according to this embodiment, the contact terminals 15 are not fixed to the suction head 14 but are supported by a support arm 52 of a contact pressing mechanism 50. The contact pressing mechanism 50 is a mechanism that moves the support arm 52 vertically by a small distance. Therefore, the contact terminals 15 attached to the support arm 52 can be moved vertically by a small distance. By moving the contact terminals 15 downward while the component 6 is attached to the suction head 14 by suction, the contacts 15A of the contact terminals 15 can be reliably brought into contact with the electrode of the component 6.

Since the contact pressing mechanism 50 only needs to move the contact terminals 15 by a small distance, a mechanism that applies pressure to a hydrostatic bearing, for example, can be used. As an alternative moving mechanism, a piezoelectric-element actuator or an air cylinder may be used.

The configuration of the transparent suction head unit 40 will be described. The suction head unit 40 includes a head supporting member 42, the suction head 14 attached to the underside of the head supporting member 42, and a transparent plate 46 attached to the opposite side of the suction head 14.

The head supporting member 42 is a plate-like member composed of, for example, stainless steel or aluminum, and is supported by a pressing mechanism 40A of the suction head unit 40. A midsection of the head supporting member 42 is provided with a through-hole 42A, and the suction head 14 is attached to the lower surface of the head supporting member 42 so as to block the through-hole 42A. On the other hand, the transparent plate 46 is attached to the upper surface of the head supporting member 42 so as to block the through-hole 42A. The suction head 14 and the transparent plate 46 are composed of, for example, transparent glass. The center of the suction head 14 protrudes downward and is provided with a nozzle 14A.

The upper and lower ends of the through-hole 42A in the head supporting member 42 are respectively blocked by the suction head 14 and the transparent plate 46 so that an enclosed space is formed therein. A suction hole 42B extending through the interior of the head supporting member 42 opens in the inner surface of the through-hole 42A. The suction hole 42B extends to the pressing mechanism 40A and connects to a vacuum generator 36, serving as a suction mechanism, via a passage within the pressing mechanism 40A. Therefore, by driving the vacuum generator 36 so as to vacuum the air from the through-hole 42A, a suction force can be generated in the nozzle 14A of the suction head 14.

The head supporting member 42 of the suction head unit 40 has attached thereto a linear scale for tactile sensing. The linear scale detects that the component 6 is placed on the installation substrate 8 and is stopped from being lowered, and increases the pressure applied by the pressing mechanism 40A at that point. In this case, since a thermosetting adhesive 20 is preliminarily applied to a corresponding component-installation position of the installation substrate 8 onto which the component 6 is placed, the thermosetting adhesive 20 is in a state where it is interposed between the lower surface of the component 6 and the upper surface of the installation substrate 8.

FIG. 9A is a plan view of the suction head 14 and the contact terminals 15. FIG. 9B is a side view of the suction head 14 and one of the contact terminals 15. The contact terminals 15 are disposed on opposite sides of the nozzle 14A and are attached to the support arm 52. By driving the contact pressing mechanism 50 so as to move the support arm 52, the contact terminals 15 can be moved. Since the suction head 14 is composed of a transparent material, the contact terminals 15 disposed on the underside of the suction head 14 are visible, as shown in FIGS. 9A and 9B.

Figure 11:
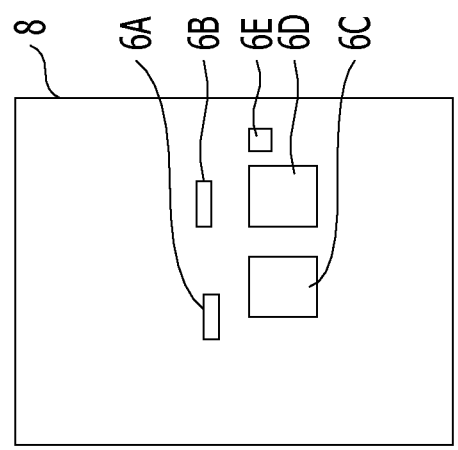
FIG. 11 is a plan view of the installation substrate equipped with the surface emitting laser (VCSEL) and other components.

The following description relates to a case where the component 6 to be mounted on the installation substrate 8 is, for example, a surface emitting laser (VCSEL). As shown in FIG. 10, a surface emitting laser (VCSEL) 6A is mounted at an installation position on the installation substrate 8. As shown in FIG. 11, other components installed on the installation substrate 8 include a photo-diode (PD) 6B serving as a photo-receiver, a driver integrated-circuit (IC) 6C for the surface emitting laser (VCSEL) 6A, a photo-diode-receiver integrated-circuit (IC) 6D, and a capacitor 6E.

Of these components, the surface emitting laser (VCSEL) 6A generates a large amount of heat when driven, and is thus suitable for the heating and curing method according to this embodiment. For example, supposing that the power consumption of the surface emitting laser (VCSEL) 6A is 10 mW, the temperature of the surface emitting laser (VCSEL) 6A when driving the surface emitting laser (VCSEL) 6A by applying electricity thereto increases by about 50° C. within a short period of time, and reaches about 75° C. when the room temperature is +50° C. Therefore, by increasing the ambient temperature, including the installation substrate 8, to about 40° C., the temperature of the surface emitting laser (VCSEL) 6A increases to about 100° C. 100° C. is higher than or equal to the curing temperature of the thermosetting adhesive 20 and is therefore sufficient for curing the thermosetting adhesive 20.

Figure 12B:
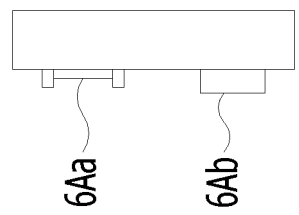
FIG. 12B is a side view of the surface emitting laser (VCSEL)
Figure 12A:
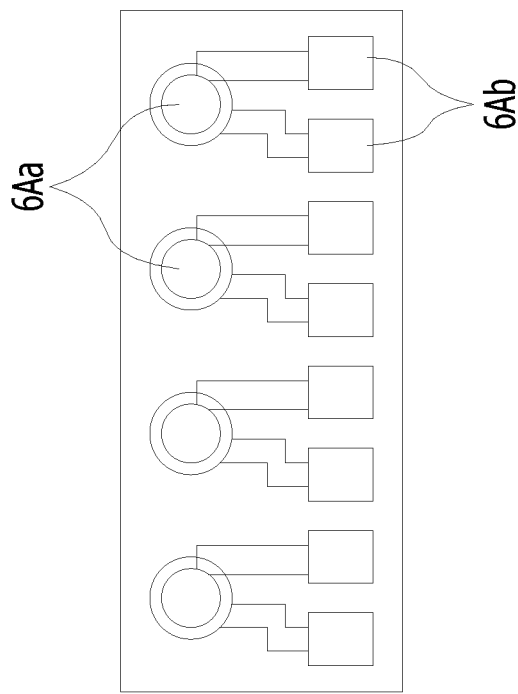
FIG. 12A is a plan view of the surface emitting laser (VCSEL)
Figure 12C:
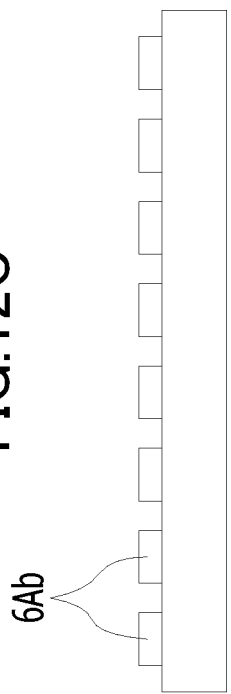
FIG. 12C is a front view of the surface emitting laser (VCSEL)

FIG. 12A is a plan view of the surface emitting laser (VCSEL) 6A. FIG. 12B is a side view of the surface emitting laser (VCSEL) 6A. FIG. 12C is a front view of the surface emitting laser (VCSEL) 6A. The surface emitting laser (VCSEL) 6A has a thin plate-like shape with a width of 400 µm, a length of 1000 µm, and a thickness of 150 µm, and has a plurality of light emitters 6Aa and a plurality of electrodes 6Ab disposed thereon. The contacts 15A of the contact terminals 15 come into contact with the electrodes 6Ab so as to supply power thereto. In the example shown in FIGS. 12A to 12C, four light emitters 6Aa are arranged in a row, and two electrodes 6Ab are disposed in correspondence with each light emitter 6Aa. The four light emitters 6Aa can be driven independently of each other.

FIG. 13 is a plan view showing a state where the surface emitting laser (VCSEL) 6A is attached by suction to the suction head 14, as viewed from above the suction head 14. A midsection of the surface emitting laser (VCSEL) 6A is attached to the nozzle 14A by suction of the suction head 14, and the contacts 15A of the contact terminals 15 are disposed at positions facing the electrodes 6Ab for the light emitters 6Aa located at the opposite ends.

Figure 14A:
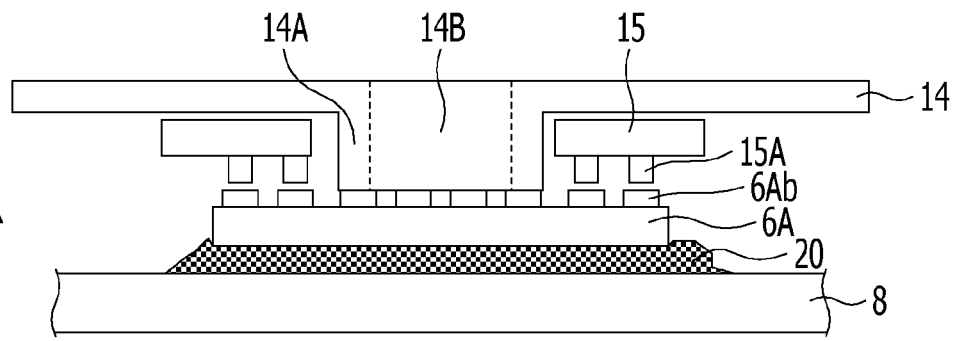
FIGS. 14A to 14C illustrate a procedure for bringing contacts into contact with electrodes of the surface emitting laser (VCSEL)
Figure 14B:
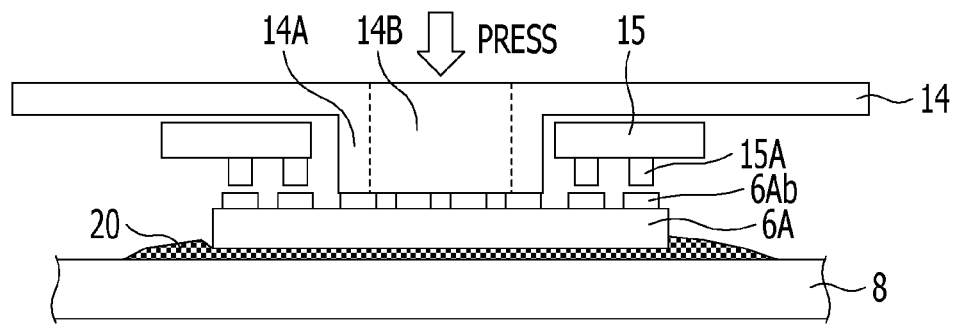
Figure 14C:
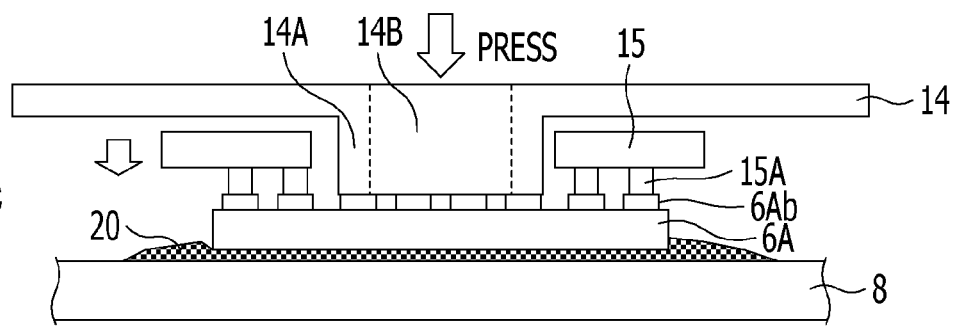

FIGS. 14A to 14C illustrate the procedure for bringing the contacts 15A into contact with the electrodes 6Ab of the surface emitting laser (VCSEL) 6A. First, as shown in FIG. 14A, the pressing mechanism 40A is driven so as to lower the suction head 14 of the suction head unit 40, thereby disposing the surface emitting laser (VCSEL) 6A, attached to the suction head 14 by suction, at the corresponding component-installation position of the installation substrate 8. The thermosetting adhesive 20 is preliminarily applied to the component-installation position, and the surface emitting laser (VCSEL) 6A approaches the surface of the installation substrate 8 while pushing the thermosetting adhesive 20 outward. In this state, the contacts 15A are not yet in contact with the electrodes 6Ab of the surface emitting laser (VCSEL) 6A.

Then, as shown in FIG. 14B, when the surface emitting laser (VCSEL) 6A is placed on the installation substrate 8, the suction head 14 stops at that position since it cannot be lowered any further. It is to be noted, however, that the pressing mechanism 40A is continuously driven so that the suction head 14 is pressed toward the installation substrate 8. In the state where the surface emitting laser (VCSEL) 6A is placed on the installation substrate 8, the thermosetting adhesive 20 with a predetermined thickness is interposed between the surface emitting laser (VCSEL) 6A and the installation substrate 8. Even at this point, the contacts 15A are still not in contact with the electrodes 6Ab of the surface emitting laser (VCSEL) 6A.

Referring to FIG. 14C, after the suction head 14 stops descending, the contact pressing mechanism 50 is driven so as to lower the contact terminals 15, thereby bringing the contacts 15A into pressure contact with the electrodes 6Ab. The suction head 14 is still maintained in the pressed state toward the installation substrate 8.

As a result of the above process, the surface emitting laser (VCSEL) 6A is placed on the installation substrate 8, and the contacts 15A are in pressure contact with the electrodes 6Ab of the surface emitting laser (VCSEL) 6A. Therefore, the electrodes 6Ab of the surface emitting laser (VCSEL) 6A are supplied with power via the contacts 15A, whereby the surface emitting laser (VCSEL) 6A is driven and can thus generate heat.

In the above-described example where the surface emitting laser (VCSEL) 6A is mounted on the installation substrate 8, since the electrodes 6Ab of the two middle light emitters 6Aa of the four light emitters 6Aa included in the surface emitting laser (VCSEL) 6A correspond to an area that is attached by suction to the suction head 14, the contacts 15A cannot be brought into contact these electrodes 6Ab. Therefore, in the above-described example, the contacts 15A are brought into contact with only the electrodes 6Ab of the two light emitters 6Aa at the opposite ends so as to drive these two light emitters 6Aa.

Figure 15:
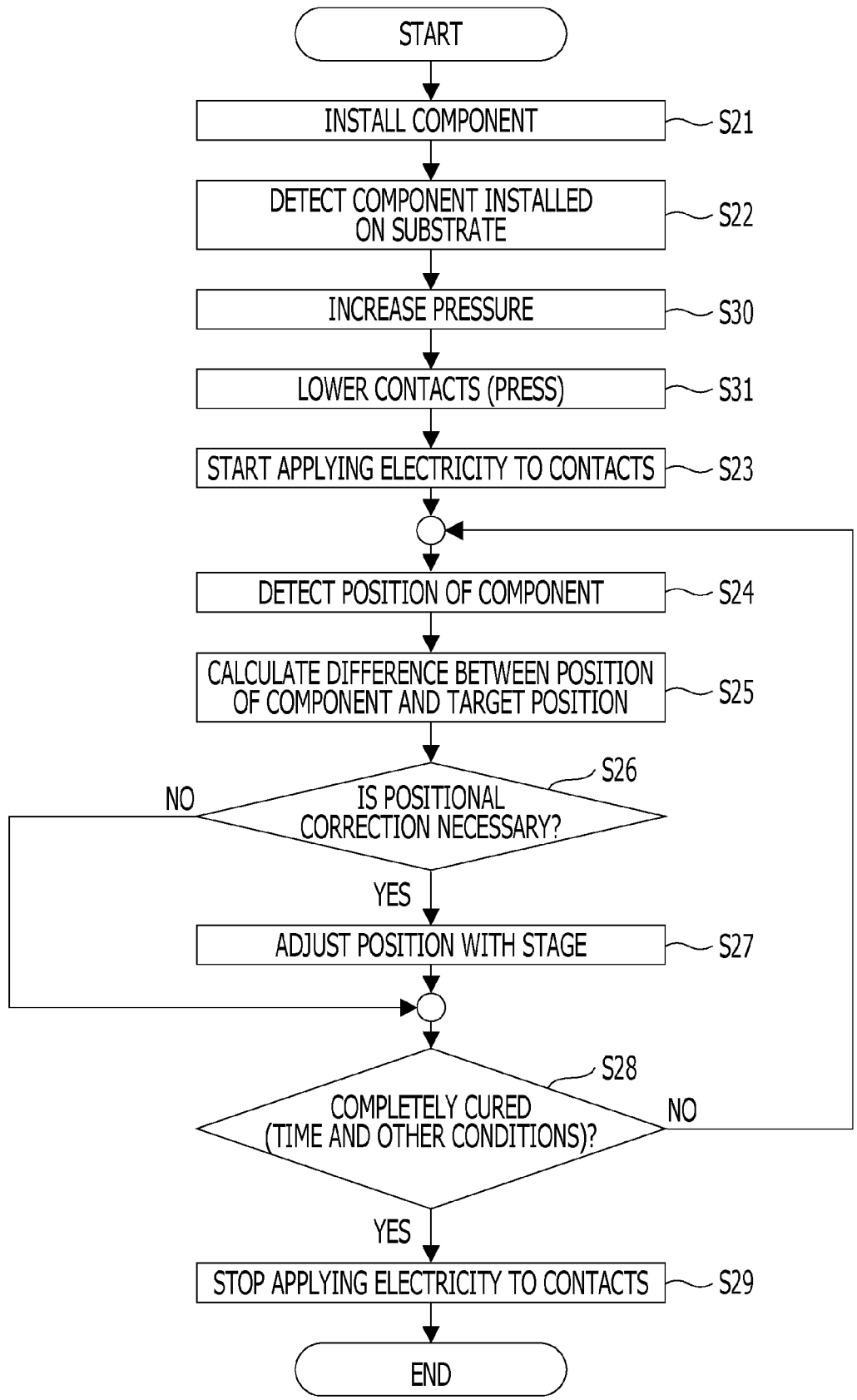
FIG. 15 illustrates a component installation process according to the third embodiment.

Next, a component-installation/heat-curing process according to this embodiment will be described with reference to FIG. 15. FIG. 15 is a flow chart of the component-installation/heat-curing process according to the third embodiment. The component-installation/heat-curing process according to the third embodiment is a combination of the component-installation/heat-curing process according to the second embodiment shown in FIG. 7 and the aforementioned process of bringing the contacts 15A into contact with the electrodes 6Ab, shown in FIG. 14. In FIG. 15, steps similar to those shown in FIG. 7 are given the same step numbers, and the descriptions thereof will not be repeated.

The process for bringing the contacts 15A into contact with the electrodes 6Ab is performed between step S22 for detecting that the component 6 (i.e., the surface emitting laser 6A) is placed on the installation substrate 8 and step S23 for starting the application of electricity to the contact terminals 15. Specifically, after step S22, the process proceeds to step S30 where the pressing mechanism 40A is driven so as to cause the suction head 14 to press the component 6 (i.e., the surface emitting laser 6A) with predetermined pressure. Then, in step S31, the contact pressing mechanism 50 is driven so as to lower the contacts 15A of the contact terminals 15 into pressure contact with the electrodes 6Ab of the component 6 (i.e., the surface emitting laser 6A) with predetermined pressure. Subsequently, in step S23, electricity is applied to the contact terminals 15.

In this case, if the component 6 to be mounted is the surface emitting laser 6A, the surface emitting laser 6A is driven for heating the thermosetting adhesive 20, and laser light is emitted from the surface emitting laser 6A. By acquiring an image of this laser light with the camera 16 so as to recognize the position of the laser light, this detected position can be used for correcting the installed position of the surface emitting laser 6A. Since the positional correction is performed on the basis of an actual light-emission point, the light-emission point can be disposed at a target position with higher accuracy, as compared with a case where the positional correction is performed on the basis of a detection result of the surface shape or the contour of the surface emitting laser 6A.

Accordingly, with the mounting method according to this embodiment, since the control computer 30 and the camera 16 positioned directly above the transparent suction head unit 40 are used for detecting the position of the component 6 (i.e., the surface emitting laser 6A) even during the heating and curing of the thermosetting adhesive 20, an error in the position of the component 6 relative to the component-installation position can be calculated, so that positional deviation of the component 6 (i.e., the surface emitting laser 6A) can be corrected by moving the table 10A until the thermosetting adhesive 20 becomes completely cured. Therefore, even when the component 6 (i.e., the surface emitting laser 6A) becomes positionally deviated in the course of curing of the thermosetting adhesive 20, this positional deviation can be immediately corrected, thereby allowing for higher mounting accuracy and reducing improper mounting. In addition, since the contacts 15A press the electrodes 6Ab of the component 6 (i.e., the surface emitting laser 6A) after the component 6 (i.e., the surface emitting laser 6A) is placed on the installation substrate 8, the component 6 (i.e., the surface emitting laser 6A) can be reliably supported by the suction head 14 without becoming detached from the suction head 14.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

The invention claimed is:

1. A mounting apparatus comprising:
a stage device on which an installation substrate and a component are placed;
a suction head that moves in a direction perpendicular to the stage device, the suction head provided vertically above the stage device;
an electrical contact mounted directly adjacent to the suction head for coming into electrical contact with an electrode of the component;
a camera provided vertically above the suction head, the camera moving in a direction perpendicular to the stage device; and
a controller that controls operation of the stage device, operation of the suction head, application of electricity to the electrical contact, and operation of the camera, wherein
the controller is configured:
to cause the electrical contact to come into electrical contact with the electrode of the component that has been attached to and held by the suction head, and
to apply electricity to the electrical contact so that the component in contact with the electrical contact via the electrode of the component is driven to generate heat.

2. The mounting apparatus according to claim 1, further comprising a driving power source that supplies power to the contact.

3. The mounting apparatus according to claim 1, wherein the suction head fixes the electrical contact to the electrode by suction.

4. The mounting apparatus according to claim 1, further comprising a moving mechanism that vertically moves the contact.

5. The mounting apparatus according to claim 1, further comprising a supplementary heater in the stage device that heats the installation substrate.

6. The mounting apparatus according to claim 1, wherein the suction head is composed of a transparent material.

7. The mounting apparatus according to claim 6, further comprising a visible-light opening that allows visible light through to an optical system of the camera.

8. The mounting apparatus according to claim 7, further comprising a half mirror within the optical system of the camera that reflects the visible light so that the visible light travels toward the suction head along an optical axis of the camera.

* * * * *